(12) United States Patent
Guzel et al.

(10) Patent No.: US 12,376,245 B2
(45) Date of Patent: Jul. 29, 2025

(54) PRESENTATION SYSTEM WITH A PORTABLE ROLL-UP LED DISPLAY

(71) Applicant: INFINIA MUHENDISLIK LIMITED SIRKETI, Ankara (TR)

(72) Inventors: Ismail Tugay Guzel, Ankara (TR); Kadem Berker Yasar, Ankara (TR)

(73) Assignee: INFINIA MUHENDISLIK LIMITED SIRKETI, Ankara (TR)

( * ) Notice: Subject to any disclaimer, the term of this patent is extended or adjusted under 35 U.S.C. 154(b) by 202 days.

(21) Appl. No.: 18/551,354

(22) PCT Filed: May 17, 2021

(86) PCT No.: PCT/TR2021/050462
§ 371 (c)(1),
(2) Date: Sep. 19, 2023

(87) PCT Pub. No.: WO2022/197264
PCT Pub. Date: Sep. 22, 2022

(65) Prior Publication Data
US 2024/0172377 A1    May 23, 2024

(30) Foreign Application Priority Data
Mar. 19, 2021    (TR) ................ 2021/005102

(51) Int. Cl.
*H05K 5/02*    (2006.01)
*G09F 9/30*    (2006.01)

(52) U.S. Cl.
CPC .......... *H05K 5/0217* (2013.01); *G09F 9/301* (2013.01); *H05K 5/0247* (2013.01)

(58) Field of Classification Search
None
See application file for complete search history.

(56) References Cited

U.S. PATENT DOCUMENTS

| | | | |
|---|---|---|---|
| 9,074,742 B1* | 7/2015 | Petrocy | G09F 9/33 |
| 2008/0055106 A1 | 3/2008 | Zhang | |
| 2014/0254157 A1 | 9/2014 | Engelen et al. | |
| 2014/0268532 A1 | 9/2014 | Nicol et al. | |
| 2018/0125228 A1* | 5/2018 | Porter | F16M 11/10 |

OTHER PUBLICATIONS

International Search Report dated Jul. 14, 2023 for Application No. PCT/TR2021/050462.
Written Opinion dated Jul. 14, 2023 for Application No. PCT/TR2021/050462.

* cited by examiner

*Primary Examiner* — Xanthia C Relford
(74) *Attorney, Agent, or Firm* — Ladas & Parry LLP

(57) ABSTRACT

The present invention relates to a system (1) for presenting motion images by means of a display with enhanced portability that consists of multiple LED panels (2) and can be rolled up upon being wound on small-diameter drums (3).

13 Claims, 1 Drawing Sheet

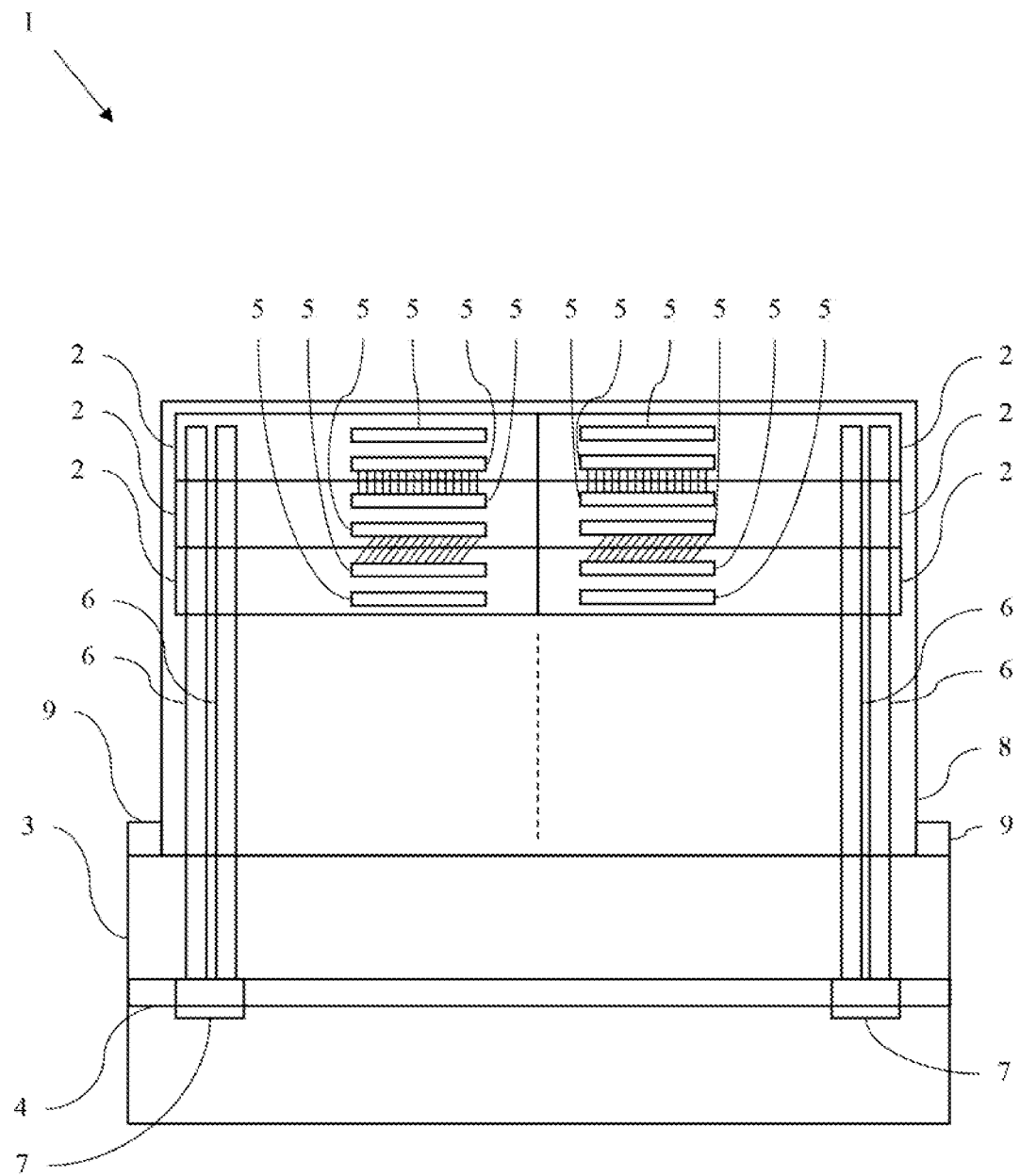

PRESENTATION SYSTEM WITH A PORTABLE ROLL-UP LED DISPLAY

RELATED APPLICATION

This application is an application under 35 U.S.C. 371 of International Application No. PCT/TR2021/050462 filed on May 17, 2021, the entire contents of which are incorporated herein by reference.

TECHNICAL FIELD

The present invention relates to a system for presenting motion images by means of a display with enhanced portability that consists of multiple LED panels and can be rolled up upon being wound on small-diameter drums.

BACKGROUND OF THE INVENTION

Presentation posters that include brand logos, personal information, product and/or service information and important information about a presentation visually and can be rolled up upon being wound on drums are prepared today. It is required to rearrange presentation posters and to replace these with previous posters within the drum according to the target audience and/or company for every presentation. The fact that contents to be presented on posters must be static images is another deficiency of presentation posters. It is not possible to present a motion image about a product and/or service to be presented.

Nevertheless, television devices can be used upon being installed in a presentation area for the purpose of presenting motion images during a presentation. In order that motion images can be displayed during a presentation, television devices must be available in the location wherein the presentation is realized or it must be moved to the presentation area. It is not possible to carry television devices by rolling up these like presentation posters.

Considering deficiencies of presentation posters and television devices in the current technique, it is understood that there is need for a system for presenting motion images by means of a display with enhanced portability that consists of multiple LED panels and can be rolled up upon being wound on small-diameter drums in the state of the art The United States patent document no. US20090128461, an application in the state of the art, discloses a system for creating rollable large-scale LED displays with a plurality of segments. The said system comprises a plurality of LED panels which are placed in transparent polycarbonate tubes and interconnected in a rollable way, a panel controller which controls the image on LED panels, a plurality of data bus which connects panel controllers to LED panels and carries out data and power transfer. The panel controller determines total size of a LED display by addressing LED panels being used and performs visual management.

SUMMARY OF THE INVENTION

An objective of the present invention is to realize a system for presenting motion images by means of a display with enhanced portability that consists of multiple LED panels and can be rolled up upon being wound on small-diameter drums.

DETAILED DESCRIPTION OF THE INVENTION

"A Presentation System with a Portable Roll-Up LED Display" realized to fulfil the objective of the present invention is shown in the FIGURE attached, in which:

FIG. 1 is a schematic drawing of the inventive device.

The components illustrated in the FIGURE are individually numbered, where the numbers refer to the following:
1. System
2. LED panel
3. Drum
4. Shaft
5. Data transfer connector
6. Busbar
7. Ring
8. Barrier
9. Guide The inventive system (1) for presenting motion images by means of a display with enhanced portability that consists of multiple LED panels and can be rolled up upon being wound on small-diameter drums comprises:
- a plurality of LED panels (2) which are in sizes such that they can be rolled up upon being wound on small-diameter drums, and enable to create a digital image;
- at least one drum (3) which enables to maintain the LED panels (2) upon being rolled up;
- at least one shaft (4) which is located at the centre of the drum (3) and enables to roll up the LED panels (2) onto thereof;
- a plurality of data transfer connectors (5) which enable to transfer image data among the LED panels (2);
- a plurality of busbars (6) which enable to transfer power to the LED panels (2) ad to create a power transfer channel;
- a plurality of rings (7) which enable to transfer power to the LED panels (2) over the copper-band busbars (6);
- at least one barrier (8) which enables to carry and roll up the LED panels (2) safely, and is located on a LED panel surface wherefrom no image is received; and
- a plurality of guides (9) whereby the barrier (8) is moved while opening and rolling up the LED panels (2).

The LED panels (2) included in the inventive system (1) are manufactured in sizes such that they can be rolled up upon being wound on small-diameter drums (3), and enable to create a digital image. In a preferred embodiment of the invention, the LED panels (2) are combined to create a display in a desired width and length.

In a preferred embodiment of the invention, the LED panels (2) can be arranged such that they will enable to create image upon being combined in a sliding and/or non-sliding way. Due to the fact that the sliding LED panels (2) perform data transfer to the subsequent non-sliding LED panels (2) by means of different pins, they enable the LED panels (2) to create image in a longer distance and in a large number by using smaller and few data transfer connectors (5).

The drum (3) included in the inventive system (1) enables to maintain the LED panels (2) upon being rolled up.

The shaft (4) included in the inventive system (1) and whereon the LED panels (2) are rolled up has a spring structure and it is located at the centre of the drum (3). Thereby, the LED panels (2) are pulled out from inside the drum (3) and when it is desired to roll up the LED panels (2) from open position into the drum (3), it is automatically wound onto the shaft (4) by means of its spring structure.

In a preferred embodiment of the invention, the shaft (4) is triggered by means of a motor; thereby the LED panels (2) can be opened and closed automatically.

The data transfer connectors (5) included in the inventive system (1) are configured to transfer image data among the LED panels (2). In a preferred embodiment of the invention, the data transfer connectors (5) enable to connect connector pins by sliding so as to ensure that an image transmitted to the LED panels (2)—that are combined in a sliding and/or non-sliding way—is transferred correctly between one another.

The busbars (6) included in the inventive system (1) are copper-band busbars. By means of the copper-band busbars (6), power is transferred to the LED panels (2) and a durable power transfer channel is created. In a preferred embodiment of the invention, the copper-band busbars (6) create a continuous power transfer channel by being applied as at least one pair connected to each column of the LED panels (2). Using copper-band busbars (6) instead of cable enables to roll up the LED panels (2) onto the shaft (4) in a small dimension as far as possible. Thereby, the LED panels (2) can be kept within the drum (3) at low volumes with a shaft (4) in a small dimension as far as possible.

The inventive system (1) also comprises spring steels which are used together with the copper busbars (6). The spring steels enable the LED panels (2) to remain in a flat form in open position.

The ring (7) included in the inventive system (1) has a copper structure with copper-carbon brush, it is used for power transfer and transfers power to the LED panels (2) over the copper busbars (6). In a preferred embodiment of the invention, the copper ring (7) with copper-carbon brush is made of copper-carbon mixture and comprises brushes with enhanced durability.

The barrier (8) included in the inventive system (1) is configured to carry and roll up the LED panels (2) safely. In a preferred embodiment of the invention, the barrier (8) protects the LED panels (2) and the power and data connections between the LED panels (2) by means of a protective barrier layer made of a flexible material.

The guides (9) included in the inventive system (1) enable the barrier (8) to move on the same axis stably while opening and rolling up the LED panels (2). In a preferred embodiment of the invention, the guides (9) direct the barrier (8) upon being placed on the edges of the entrance surfaces of the drum (3). Thereby, lifetimes of the LED panels (2) and therefore of the display are extended.

The inventive system (1) enables to create a display whereby motion images can be presented by means of both sliding and non-sliding LED panels (2) and the portability of which is enhanced by being maintained inside the drum (3), to adapt a display to different applications by being sized in line with the user needs, and to maintain a display—which is created by durable power and data transfer elements—by being rolled up within small-volume drums (3) safely.

Within these basic concepts; it is possible to develop various embodiments of the inventive "Presentation System with a Portable Roll-Up LED Display (1)"; the invention cannot be limited to examples disclosed herein and it is essentially according to claims.

The invention claimed is:

1. A system (1) for presenting motion images by means of a display with enhanced portability that consists of multiple LED panels and can be rolled up upon being wound on small-diameter drums, characterized by:
   a plurality of LED panels (2) which are in sizes such that they can be rolled up upon being wound on small-diameter drums, and enable to create a digital image;
   at least one drum (3) which enables to maintain the LED panels (2) upon being rolled up;
   at least one shaft (4) which is located at the centre of the drum (3) and enables to roll up the LED panels (2) onto thereof;
   a plurality of data transfer connectors (5) which enable to transfer image data among the LED panels (2);
   a plurality of copper-band busbars (6) which enable to transfer power to the LED panels (2) and to create a power transfer channel;
   a plurality of rings (7) which enable to transfer power to the LED panels (2) over the copper-band busbars (6);
   at least one barrier (8) which enables to carry and roll up the LED panels (2) safely, and is located on a LED panel surface wherefrom no image is received; and
   a plurality of guides (9) whereby the barrier (8) is moved while opening and rolling up the LED panels (2).

2. The system (1) according to claim 1; characterized by the LED panels (2) which are manufactured in sizes such that they can be rolled up upon being wound on small-diameter drums (3), and enable to create a digital image.

3. The system (1) according to claim 1; characterized by the LED panels (2) which are combined to create a display in a desired width and length.

4. The system (1) according to claim 1; characterized by the LED panels (2) which are arranged such that they will enable to create image upon being combined in a sliding and/or non-sliding way.

5. The system (1) according to claim 1; characterized by the shaft (4) which has a spring structure, is located at center of the drum (3) and whereon the LED panels (2) are rolled up.

6. The system (1) according to claim 1; characterized by the data transfer connectors (5) which enable to connect connector pins by sliding so as to ensure that an image transmitted to the LED panels (2)—that are combined in a sliding and/or non-sliding way—is transferred correctly between one another.

7. The system (1) according to claim 1; characterized by the copper-band busbars (6) which create a continuous power transfer channel by being applied as at least one pair connected to each column of the LED panels (2).

8. The system (1) according to claim 1; characterized by the spring steels which are used together with the copper busbars (6).

9. The system (1) according to claim 1; characterized by the ring (7) which has a copper structure with copper-carbon brush, is used for power transfer and transfers power to the LED panels (2) over the copper busbars (6).

10. The system (1) according to claim 9; characterized by the copper ring (7) with copper-carbon brush which is made of copper-carbon mixture and comprises brushes with enhanced durability.

11. The system (1) according to claim 1; characterized by the barrier (8) which protects the LED panels (2) and the power and data connections between the LED panels (2) by means of a protective barrier layer made of a flexible material.

12. The system (1) according to claim 1; characterized by the guides (9) which enable the barrier (8) to move on the same axis stably while opening and rolling up the LED panels (2).

13. The system (1) according to claim 1; characterized by the guides (9) which direct the barrier (8) upon being placed on the edges of the entrance surfaces of the drum (3).

* * * * *